(12) United States Patent
Krishnakumar et al.

(10) Patent No.: US 11,442,105 B2
(45) Date of Patent: Sep. 13, 2022

(54) DISAGGREGATED DISTRIBUTED MEASUREMENT ANALYSIS SYSTEM USING DYNAMIC APPLICATION BUILDER

(71) Applicant: Tektronix, Inc., Beaverton, OR (US)

(72) Inventors: Sriram Mandyam Krishnakumar, Bengaluru (IN); Mahesha Guttahalli Lakshmipathy, Bengaluru (IN); Satish Kumar Makanahalli Ramaiah, Bengaluru Rural District (IN); Vishnu Vardhan Kandan, Bengaluru (IN); Rovin Jolly Pulikken, Bengaluru (IN)

(73) Assignee: Tektronix, Inc., Beaverton, OR (US)

( * ) Notice: Subject to any disclaimer, the term of this patent is extended or adjusted under 35 U.S.C. 154(b) by 426 days.

(21) Appl. No.: 16/740,112

(22) Filed: Jan. 10, 2020

(65) Prior Publication Data
US 2020/0225287 A1 Jul. 16, 2020

(30) Foreign Application Priority Data
Jan. 10, 2019 (IN) .............................. 201921001261

(51) Int. Cl.
*G01R 31/3183* (2006.01)
*G01R 31/28* (2006.01)

(52) U.S. Cl.
CPC . *G01R 31/318307* (2013.01); *G01R 31/2834* (2013.01); *G01R 31/318314* (2013.01)

(58) Field of Classification Search
CPC ........ G01R 31/318307; G01R 31/2834; G01R 31/318314; G06F 11/3006; G06F 11/3664
See application file for complete search history.

(56) References Cited

U.S. PATENT DOCUMENTS

| | | | | |
|---|---|---|---|---|
| 7,454,659 | B1 * | 11/2008 | Gaudette | G06F 11/3664 714/33 |
| 2004/0225465 | A1 * | 11/2004 | Pramanick | G01R 31/31907 702/119 |
| 2013/0104106 | A1 * | 4/2013 | Brown | G06F 11/3696 717/124 |

OTHER PUBLICATIONS

Fortino, G. et al, Multicast control of mobile measurement systems, IMTC/98 Conference Proceedings. IEEE Instrumentation and Measurement Technology Conference, May 18, 1998, pp. 108-114, vol. 1, IEEE, New York, NY, USA.
Grimaldi, Domenico et al., Java-Based Distributed Measurement Systems, IEEE Transactions on Instrumentation and Measurement, Feb. 1998, pp. 100-103, vol. 47, Issue 1, IEEE, Piscataway, NJ, USA.

(Continued)

*Primary Examiner* — Shelly A Chase
(74) *Attorney, Agent, or Firm* — Seed IP Law Group LLP; Andrew J. Harrington

(57) ABSTRACT

Disaggregated distributed measurement analysis systems provide a test and measurement automation platform that uses solution workflow metadata to create automation test suites as solutions to be deployed in an automation engine of a test and measurement automation platform. The automation platform provides tools and techniques to develop measurements and deploy solutions in an automation engine without requiring the system to restart. The system enables, by the test and measurement automation platform, a user to develop measurements for the solutions and deploy and execute each of the solutions in the automation engine of the test and measurement automation platform without requiring the solution to compile.

41 Claims, 6 Drawing Sheets

(56) References Cited

OTHER PUBLICATIONS

European Patent Office, International Search Report and Written Opinion of the Internal Searching Authority for International Application No. PCT/US2020/013189, dated May 7, 2020, 16 pages, Rijswijk, NL.

* cited by examiner

DISAGGREGATED DISTRIBUTED MEASUREMENT ANALYSIS SYSTEM USING DYNAMIC APPLICATION BUILDER

TECHNICAL FIELD

The technical field relates to collaborative computing technologies and, in particular, to disaggregated distributed measurement analysis systems.

BRIEF SUMMARY

Presently, the conventional technical solutions available in the market for creating automation test suites for devices such as integrated circuits are customized programmatic interfaces. Such programmatic interfaces have two distinct problems. First, the users of the system need to understand programming languages, which work on the concept of write, build and deploy. Second, the known programmatic interfaces require users to integrate and then install the program within the desired software ecosystem, as well as to restart the application when the application is installed. Some of these solutions are specific to only one piece of hardware, and may only address limited portions of the unique hardware that they manage.

Furthermore, other conventional solutions require additional hardware over and above the hardware they are managing. Additionally, some of the automation test suites for test and measurement systems have solutions that are specific for particular interfaces, such as HDMI, USB, PCI etc., and are not valid for other interfaces.

Therefore, there is a need to address the above mentioned technical problems and limitations of the presently known systems.

Thus, the systems and methods described herein: provide an automation platform that uses metadata to create automation test suites in disaggregated software; enable the automation platform to provide techniques to write measurements and deploy in the automation engine without requiring the system to restart; and provide a method that uses metadata to create automation test suites in disaggregated software.

According to at least one embodiment, a computerized method for creating and executing automated test suites in a test and measurement system, comprises: receiving, by at least one computer processor, input indicative of measurements to be performed for a device under test (DUT) and a solution workflow of a first solution that comprises an automation test suite; and executing, by at least one computer processor, instructions of the first solution dynamically in order to perform measurements on the DUT without having to compile the first solution.

The method may further comprise creating, by at least one computer processor, solution workflow metadata associated with the first solution in response to receiving the input.

The executing of the instructions may include using the solution workflow metadata to facilitate the execution of the instructions of the first solution dynamically without having to compile the first solution.

The method may further comprise using, by at least one computer processor, the solution workflow metadata to build the first solution to prepare it for execution without compiling after the first solution is deployed in the test and measurement system. The executing the instructions of the first solution may be based on the solution workflow metadata associated with the first solution.

The executing of the instructions may include using the solution workflow metadata to facilitate the execution of the first solution dynamically without requiring the test and measurement system to restart.

The method may further comprise providing a user interface that is configured to, in response to user input, communicate with an application programming interface (API) to execute the solution workflow based on the solution workflow metadata as part of execution of the instructions.

The method may further comprise receiving, by at least one computer processor, input indicative of additional measurements to be performed and of a different solution workflow of a second solution that comprises another automation test suite; creating, by at least one computer processor, solution workflow metadata associated with the second solution in response to receiving the input; and executing, by at least one computer processor, instructions of the second solution dynamically based on the solution workflow metadata associated with the second solution in order to perform measurements on the DUT without having to compile and without having to restart the test and measurement system between the execution of the instructions of the first solution and the execution of the instructions of the second solution.

The executing of the instructions may include calling multiple services which are self-registered as part of the test and measurement system.

The automation engine of the test and measurement automation platform may be built on a distributed architecture and supports failover and recovery.

According to at least one embodiment, a computerized method for enabling creation of automated test suites in a test and measurement system, comprises: providing, by at least one computer processor, a test and measurement automation platform that uses solution workflow metadata to create automation test suites with disaggregated software as solutions to be deployed in an automation engine of the test and measurement automation platform; and enabling, by the test and measurement automation platform, a user to develop measurements for the solutions and deploy each of the solutions in the automation engine of the test and measurement automation platform without requiring the test and measurement system to restart.

The providing of the test and measurement automation platform may include providing a test and measurement automation platform that is configured to: receive input about a first one of the solutions; and execute instructions of the first one of the solutions dynamically in order to perform tests on an integrated circuit.

According to various embodiments, a system for creating and executing automated test suites in a test and measurement system comprises: at least one memory; and at least one processor coupled to the at least one memory, wherein the at least one memory has computer-executable instructions stored thereon that, when executed, cause the at least one processor to perform one or more of the methods described above.

According to various embodiments, a non-transitory computer-readable storage medium has computer executable instructions stored thereon that, when executed by at least one processor, cause the at least one processor to perform one or more of the methods described above.

BRIEF DESCRIPTION OF THE DRAWINGS

The components in the drawings are not necessarily to scale relative to each other. Like reference numerals designate corresponding parts throughout the several views.

DETAILED DESCRIPTION

The various embodiments of the present technical disclosure provide an operation platform that uses metadata to create automation test suites in disaggregated software. The presently disclosed automation platform provides tools and techniques to develop or write measurements and deploy an associated solution workflow that comprises an automation test suite in the automation engine without requiring the system to restart. Further, the measurements are self-registered in the present system and they are immediately made available to the user.

Figure 1:
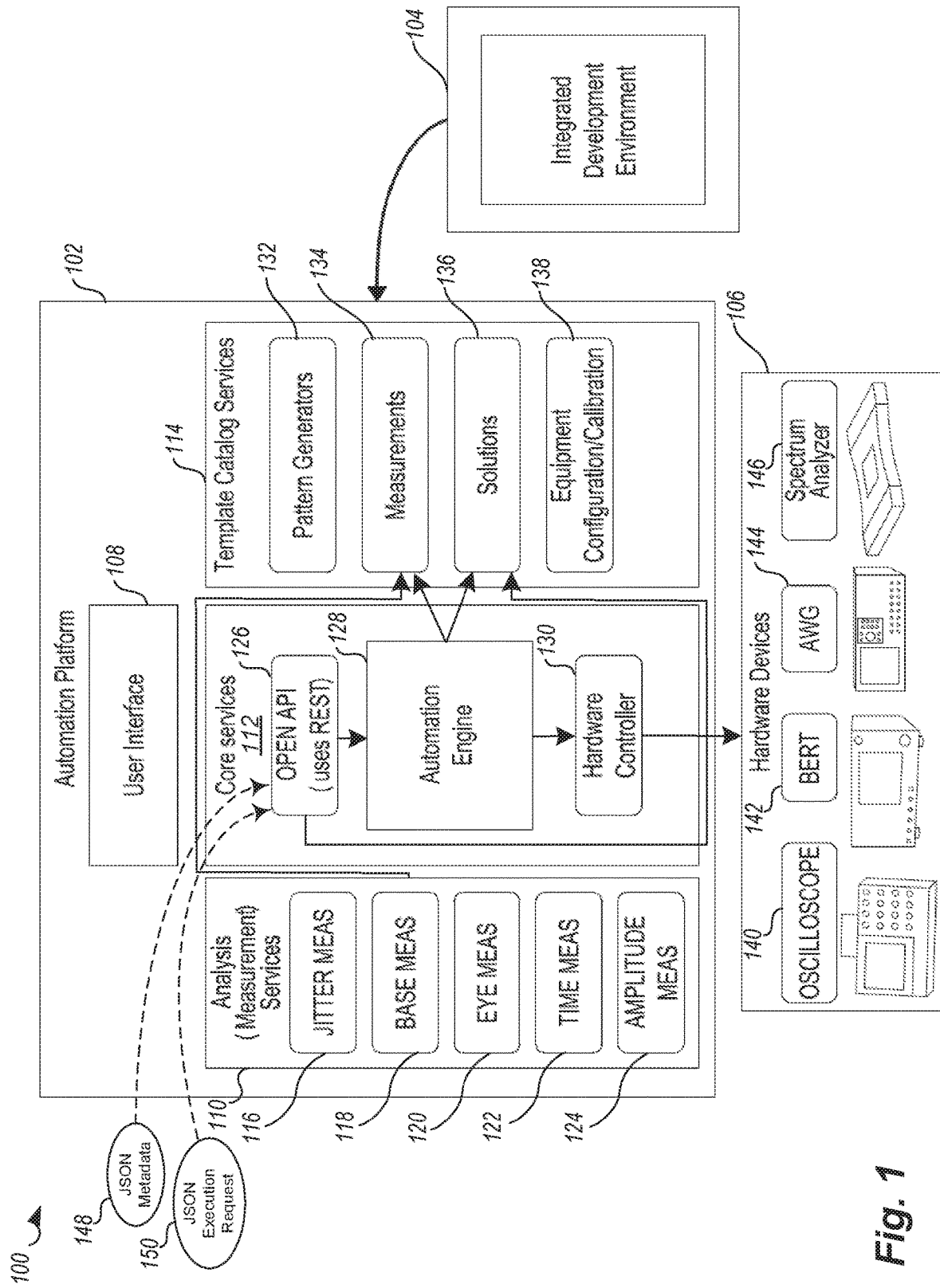
FIG. 1 is a block diagram illustrating elements of an example test and measurement system that is a disaggregated distributed measurement analysis system including an automation platform, according to various example embodiments.

FIG. 1 is a block diagram illustrating elements of an example test and measurement system 100 that is a disaggregated distributed measurement analysis system including an automation platform, according to various example embodiments. Shown in FIG. 1 is an automation platform 102, an integrated development environment (IDE) 104 and hardware devices 106.

The automation platform 102 includes a user interface 108, an analysis (measurement) services engine 110, a core services engine 112 and a template catalog services engine 114. The analysis services engine 110, in this example, includes signal measurement services such as jitter measurement services 116, base measurement services 118, eye measurement services 120, time measurement services 122 and amplitude measurement services 124.

The core service engine 112 includes an open application programming interface (API) 126, which may be a Representational State Transfer (RESTful or REST) API which is designed to take advantage of existing protocols. Since REST can be used over nearly any protocol, developers do not need to install libraries or additional software in order to take advantage of a REST API design. Unlike Simple Object Access Protocol (SOAP), REST is not constrained to Extensible Markup Language (XML), but instead can return XML, JavaScript Object Notation (JSON) or any other format depending on what the client requests. And unlike Remote Procedure Call RPC, users aren't required to know procedure names or specific parameters in a specific order.

The core service engine 112 also includes an automation engine 128 and a hardware controller 130, discussed in greater detail below.

The template catalog services engine 114, in this example, includes pattern generators 132, a measurements catalog service 134, a solutions catalog service 136 and an equipment configuration/calibration catalog service 138. The automation platform provides the user interface 108 to facilitate building of the solutions by at least providing as part of the user interface a menu of templates of test automation workflows or solutions from which the user may select to base one or more of the solutions on.

Example testing devices of the hardware devices 106 include an oscilloscope 140, a bit error rate tester (BERT) 142, an arbitrary waveform generator (AWG) 144 and a spectrum analyzer 146.

With the help of the embodiments of the present technical disclosure, the system 100 provides an extensibility capability to add new measurements in a test and measurement system without needing to restart the application. Further, the automation platform 102 also provides functionality to create useful solutions using a solution builder within the user Interface 108, and to publish the solutions directly and immediately into the ecosystem without having to restart the system 100.

In another embodiment, the new solutions can also be created using API 126. Further, the automation platform 102 also helps customers to define workflow in their test suites which can include different types of hardware like the oscilloscope 140, BERT 142, AWG 144, etc.

The automation platform 102 is a disaggregated software solution that controls hardware devices 106, performs analysis of the measurements (e.g., waveforms) obtained by the hardware devices 106, and executes the solution with APIs, such as API 126, via a user interface that provides the user with a visualization experience. For example, the automation platform 102 enables visualization by the user of how the test and measurement automation platform 102 controls hardware devices 106, performs analysis of measurements (e.g., waveforms) and executes the solutions.

Furthermore, the test and measurement system 100 according to embodiments of the present technical disclosure is metadata-based, which allows the solution to be deployed without having to compile or restart. The IDE 104 is used to deploy the measurement services 110 in the software environment of the automation platform 102. The measurement services 110 which are deployed self-register upon startup into the measurements catalog service 134. Once self-registered the measurement services 110 are accessible to the automation engine 128 to execute measurements during application execution. The solutions are built once deployed in the system 100, and are immediately available to be used throughout the system. A solution/application builder of the user interface 108 uses a template-based approach via use of the template catalog services 114, thus reducing the overall time for development and deployment.

Additionally, in one or more embodiments, the automation platform 102 may be written in JSON. The automation platform 102 can be written similar to other approaches that use Domain Specific Languages (DSL). The automation engine 128 reads the user input provided about the solution and dynamically executes the instructions. For example, the automation platform 102 may receive input indicative of measurements to be performed for a device under test (DUT) and of a solution workflow of a first solution that comprises an automation test suite. The automation platform 102 then executes instructions of the first solution dynamically in order to perform tests on the DUT without having to compile the solution. The automation platform 102 creates solution workflow metadata associated with the first solution in response to receiving the input. The execution of the instructions may include using the solution workflow metadata to facilitate the execution of the solution dynamically without having to compile. The execution of the instructions may also include using the solution workflow metadata to facilitate the execution of the first solution dynamically without requiring the test and measurement system to restart. Diagrammatic flow shows creation and deployment the solution metadata (e.g., JSON metadata 148) is created and deployed into the solutions catalog service 136 via the API 126. The solutions catalog service 136 validates the metadata content for correctness and stores it. In one example embodiment, the metadata creation and deployment is performed via use of the API 126 (e.g., utilizing OpenAPI using JSON over HyperText Transfer Protocol (HTTP)).

The user interface 108 is configured to, in response to user input, communicate with the API 126 to execute the solution workflow based on the solution workflow metadata as part of execution of the instructions. Shown is an example execution request 150 (e.g., a JSON execution request) to execute the metadata instruction (e.g., JSON metadata 148) by retrieving the metadata from the solutions catalog service 136 by the automation engine 128. The automation engine 128 validates the solution execution request 150 against the solution metadata and executes the solution and measurements defined in solution. For example, the user may send the execution instruction using API 126 (e.g., utilizing OpenAPI using JSON over HTTP protocol).

In at least one embodiment, the automation engine 128 uses a microservices approach to call multiple services that are self-registered as part of the ecosystem. The measurement services 110 which are deployed self-register upon startup into the measurements catalog service 134. Once self-registered the measurement services 110 are accessible to the automation engine 128 to execute measurements during application execution. The automation engine 128 is built on a distributed architecture and supports failover and recovery.

The automation platform 102 may enable creating and executing multiple automated test suites in the test and measurement system 100 without having to restart the system between executions of the test suites. For example, the automation platform 102 may receive input about a second solution, and then create solution workflow metadata associated with the second solution in response to receiving the input about the second solution. The automation platform 102 then executes instructions of the second solution dynamically based on the metadata associated with the second solution in order to perform tests on the DUT without having to compile and without having to restart the test and measurement system 100 between the execution of the instructions of the first solution and the execution of the instructions of the second solution.

Further, embodiments of the present technical disclosure provide an extensibility feature that enables the end user to modify the workflow or solution, so that additional requirements for testing of a DUT may be added at any time, thus reducing the overall time to market.

Figure 2:
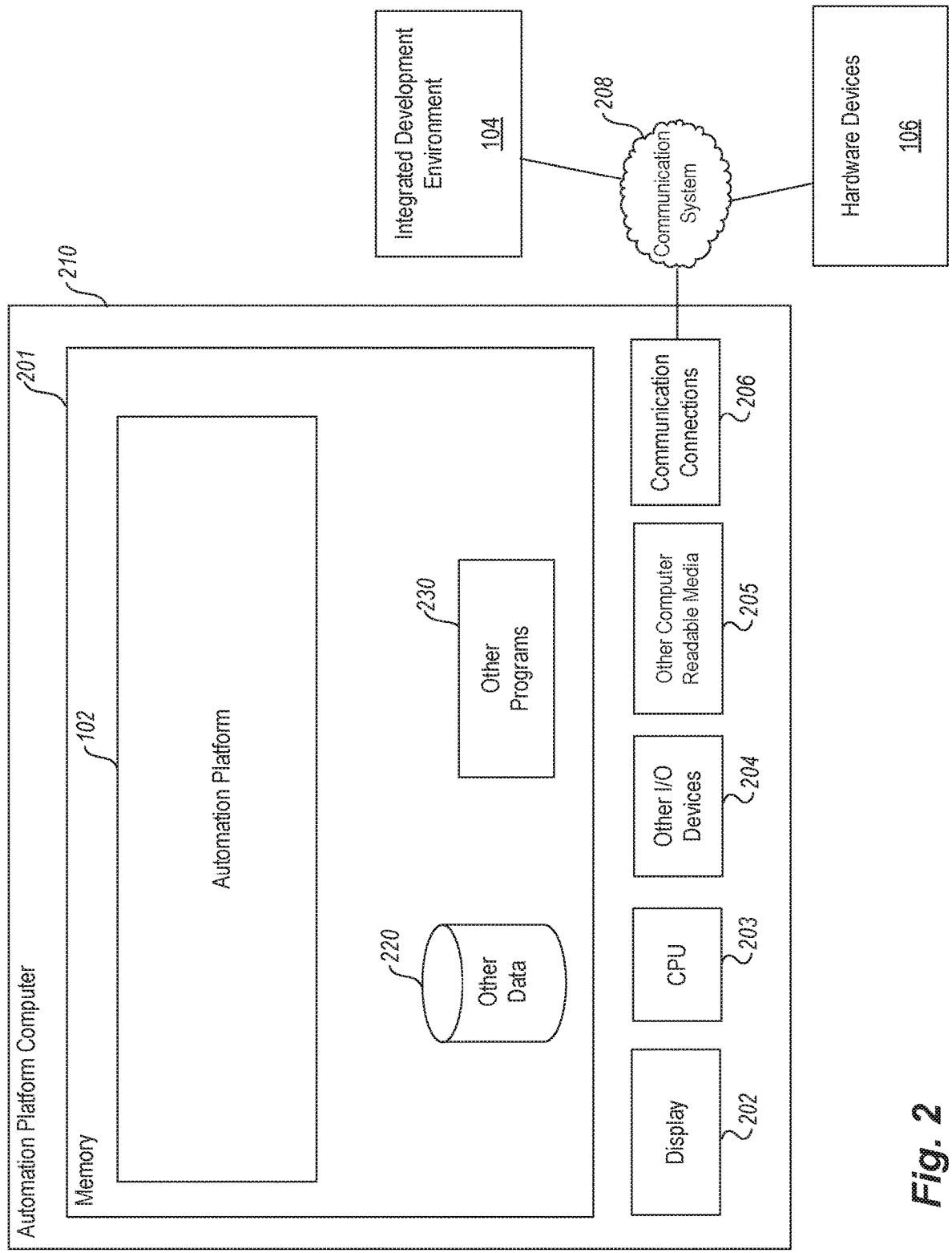
FIG. 2 is an overview block diagram illustrating an example computing device in which embodiments of the automation platform of the test and measurement system may be implemented, according to various example embodiments.

FIG. 2 is a block diagram illustrating an example automation platform computer 210 in which embodiments of the automation platform of the test and measurement system 100 may be implemented, according to various example embodiments. In the embodiment shown, automation platform computer 210 comprises a computer memory ("memory") 201, a display 202 (including, but not limited to a light emitting diode (LED) panel, liquid crystal display (LCD), touch screen display, etc.), one or more Central Processing Units ("CPU") 203, Input/Output devices 204 (e.g., button panel, keyboard, mouse, RF or infrared receiver, universal serial bus (USB) ports, other communication ports, and the like), other computer-readable media 205, and communication connections 206. The automation platform 102 is shown residing in the memory 201. In other embodiments, some portion of the contents and some, or all, of the components of the automation platform 102 may be stored on and/or transmitted over the other computer-readable media 205. The components of the automation platform 102 preferably execute on one or more CPUs 203 and perform or otherwise facilitate receiving input indicative of measurements to be performed for a DUT and solution workflow of a first solution that comprises an automation test suite; and executing instructions of the first solution dynamically in order to perform tests on the DUT without having to compile the solution. The components of the automation platform 102 preferably execute on one or more CPUs 203 and may also perform or otherwise facilitate providing a test and measurement automation platform 102 that uses solution workflow metadata to create automated test suites with disaggregated software as solutions to be deployed in an automation engine of the test and measurement automation platform; and enabling a user to develop measurements for the solutions and deploy each of the solutions in the automation engine 128 of the test and measurement automation platform 102 without requiring the test and measurement system 100 to restart.

In other embodiments, other processing devices and configurations may be used, including, but not limited to, graphics processing units (GPU), ASICs and embedded CPU/GPU blocks. The automation platform 102 may operate as, be part of, or work in conjunction and/or cooperation with, various software applications stored in memory 201. The automation platform 102 also facilitates communication with the IDE 104 and the hardware devices 106 via communication system 208. Communication system 208 may include many different types of communication media including those utilized by various different physical and logical channels of communication, now known or later developed. Non-limiting media and communication channel examples include one or more, or any operable combination of: High-Definition Multimedia Interface (HDMI), Universal Serial Bus (USB), Peripheral Component Interconnect (PCI), Wi-Fi systems, WLAN systems, short range wireless (e.g., Bluetooth®) systems, peer-to-peer network systems, hardwired systems, communication busses, computer network cabling, wide area network (WAN) systems, the Internet, cable systems, telephone systems, fiber optic systems, microwave systems, asynchronous transfer mode ("ATM") systems, frame relay systems, digital subscriber line ("DSL") systems, radio frequency ("RF") systems, cellular systems, and satellite systems.

The automation platform 102 includes an API 126 (shown in FIG. 1) that provides programmatic access to one or more functions or services of the test and measurement system 100, including for example services of the analysis services engine 110, the core services engine 112 and the template catalog services engine 114 shown in FIG. 1. For example, such an API 126 may provide a programmatic interface to one or more functions of the automation platform 102 that may be invoked by the analysis services engine 110, the core services engine 112 and the template catalog services engine 114 and/or one of the other programs 230.

In an example embodiment, components/modules of the automation platform 102 are implemented using standard programming techniques. For example, the automation platform 102 may be implemented as a "native" executable running on the CPU 203, along with one or more static or dynamic libraries. In other embodiments, the automation platform 102 may be implemented as instructions processed by a virtual machine that executes as one of the other programs 230. In general, a range of programming languages known in the art may be employed for implementing such example embodiments, including representative implementations of various programming language paradigms, including but not limited to, object-oriented (e.g., JSON, Java, C++, C#, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, Scratch, Python, JavaScript, VBScript, and the like), or declarative (e.g., SQL, Prolog, and the like).

In a software or firmware implementation, instructions stored in a memory configure, when executed, one or more processors (e.g., CPUs) of the automation platform computer 210 to perform the functions of the automation platform 102. The instructions cause the CPU 203 or some other processor, such as an I/O controller/processor, to perform the processes described herein.

The embodiments described above may also use well-known or other synchronous or asynchronous client-server computing techniques. However, the various components may be implemented using more monolithic programming techniques as well, for example, as an executable running on a single CPU computer system, or alternatively decomposed using a variety of structuring techniques known in the art, including but not limited to, multiprogramming, multi-threading, client-server, or peer-to-peer (e.g., Bluetooth® wireless technology), running on one or more computer systems each having one or more CPUs or other processors. Some embodiments may execute concurrently and asynchronously, and communicate using message passing techniques. Equivalent synchronous embodiments are also supported by an automation platform 102 implementation. Also, other functions could be implemented and/or performed by each component/module, and in different orders, and by different components/modules, yet still achieve the functions of the automation platform 102.

In addition, programming interfaces to the data stored as part of the automation platform 102 can be available by standard mechanisms such as through C, C++, C#, and Java APIs; libraries for accessing files, databases, or other data repositories; scripting languages; or Web servers, FTP servers, or other types of servers providing access to stored data and machine learning models.

Different configurations and locations of programs and data are contemplated for use with techniques described herein. A variety of distributed computing techniques are appropriate for implementing the components of the illustrated embodiments in a distributed manner including but not limited to TCP/IP, REST, sockets, RPC, RMI, HTTP, and Web Services (XML-RPC, JAX-RPC, SOAP, and the like). Other variations are possible. Other functionality could also be provided by each component/module, or existing functionality could be distributed amongst the components/modules in different ways, yet still achieve the functions of the automation platform 102.

Furthermore, in some embodiments, some or all of the components of automation platform 102 may be implemented or provided in other manners, such as at least partially in firmware and/or hardware, including, but not limited to one or more application-specific integrated circuits ("ASICs"), standard integrated circuits, controllers (e.g., by executing appropriate instructions, and including microcontrollers and/or embedded controllers), field-programmable gate arrays ("FPGAs"), complex programmable logic devices ("CPLDs"), and the like. Some or all of the system components and/or data structures may also be stored as contents (e.g., as executable or other machine-readable software instructions or structured data) on a computer-readable medium (e.g., as a hard disk; a memory; a computer network, cellular wireless network or other data transmission medium; or a portable media article to be read by an appropriate drive or via an appropriate connection, such as a flash memory device) so as to enable or configure the computer-readable medium and/or one or more associated computing systems or devices to execute or otherwise use, or provide the contents to perform, at least some of the described techniques.

Figure 3:
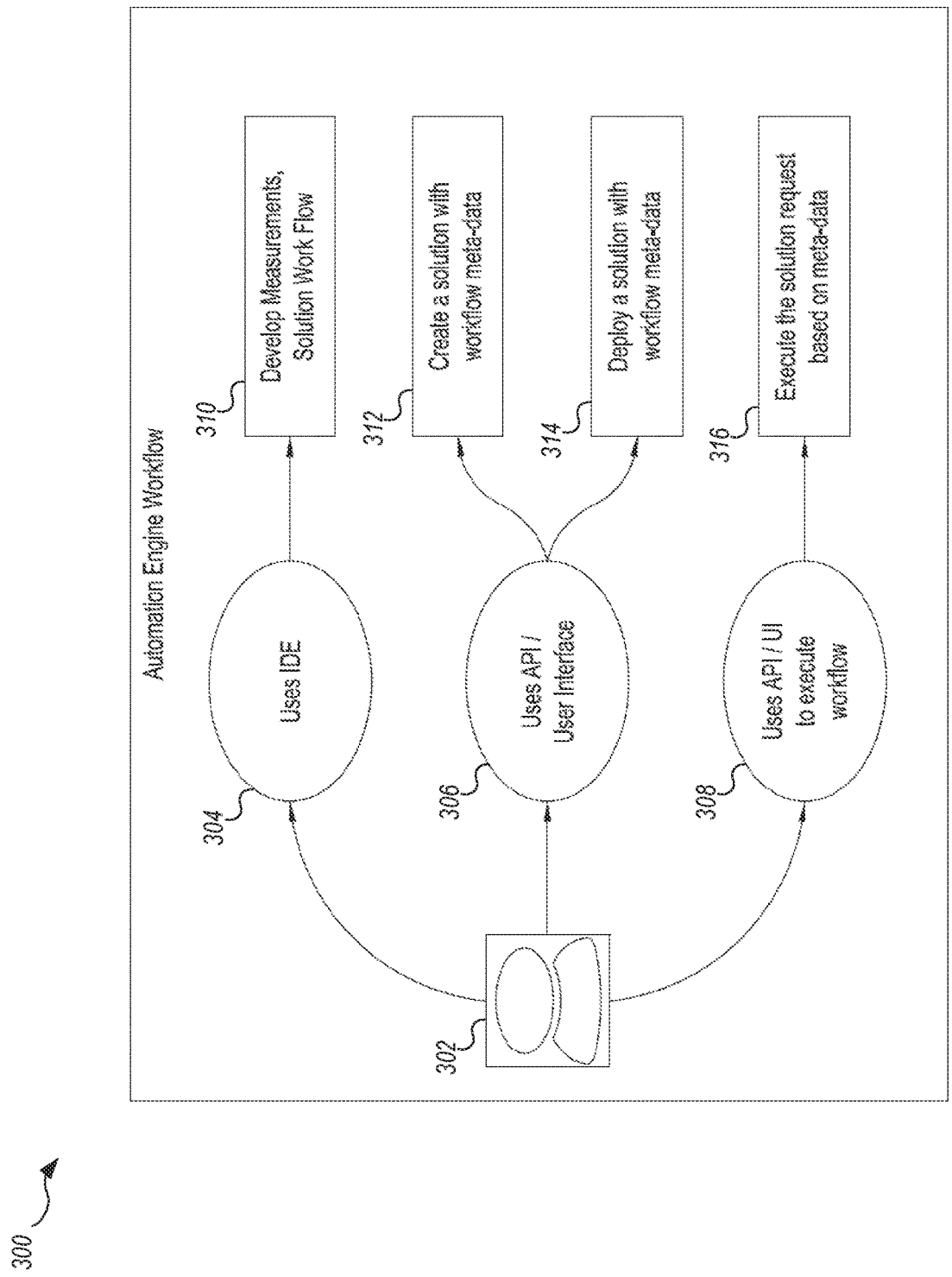
FIG. 3 is a diagram illustrating automation engine workflow which may be deployed on the automation platform, according to various example embodiments.

FIG. 3 is a diagram illustrating an example automation engine workflow 300 which may be deployed on the automation platform 102, according to various example embodiments. FIG. 3 provides the example workflow which shows how a user 302, utilizing the automation platform 102: performs a first action 304 by using the IDE 104 to cause the automation platform 102 to develop measurements and solution workflow 310; performs a second action 306 by using the API 126 and user interface 108 to cause the automation platform 102 to create a solution with workflow metadata 312 and deploy the solution in the automation engine 128 with workflow metadata 314 with the help of APIs; and then perform a third action 308 using the API 126 and user interface 108 to cause the automation platform 102 to execute the solution request based on the metadata 316, with the help of the APIs.

Figure 4:
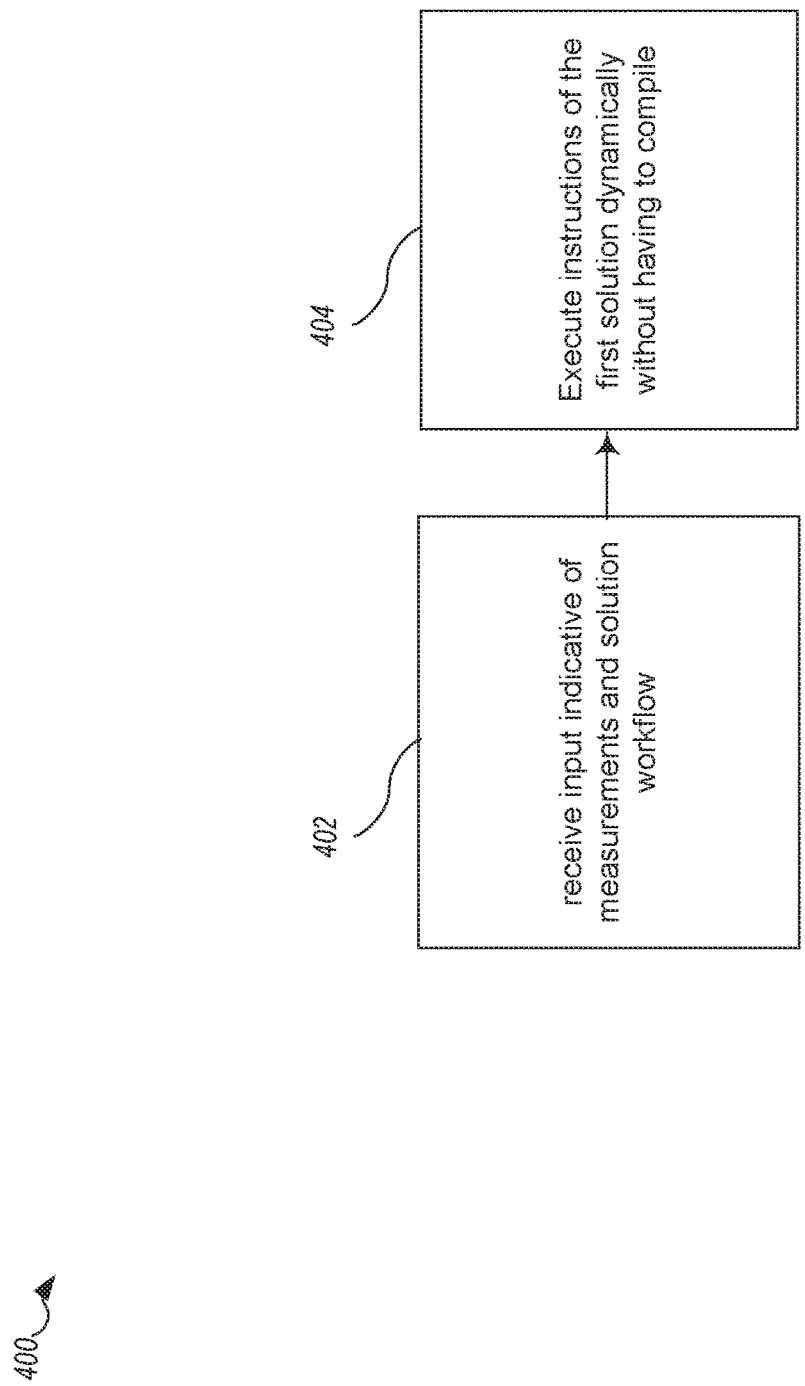
FIG. 4 is a flow diagram of a computerized method for creating and executing automated test suites in a test and measurement system, according to various example embodiments.

FIG. 4 is a flow diagram of a computerized method 400 for creating and executing automated test suites in a test and measurement system 100, according to various example embodiments.

At 402, the system 100 receives input indicative of measurements to be performed for a DUT and solution workflow of a first solution that comprises an automation test suite.

At 404, the system executes instructions of the solution dynamically in order to perform measurements on the DUT without having to compile the first solution.

Figure 5:
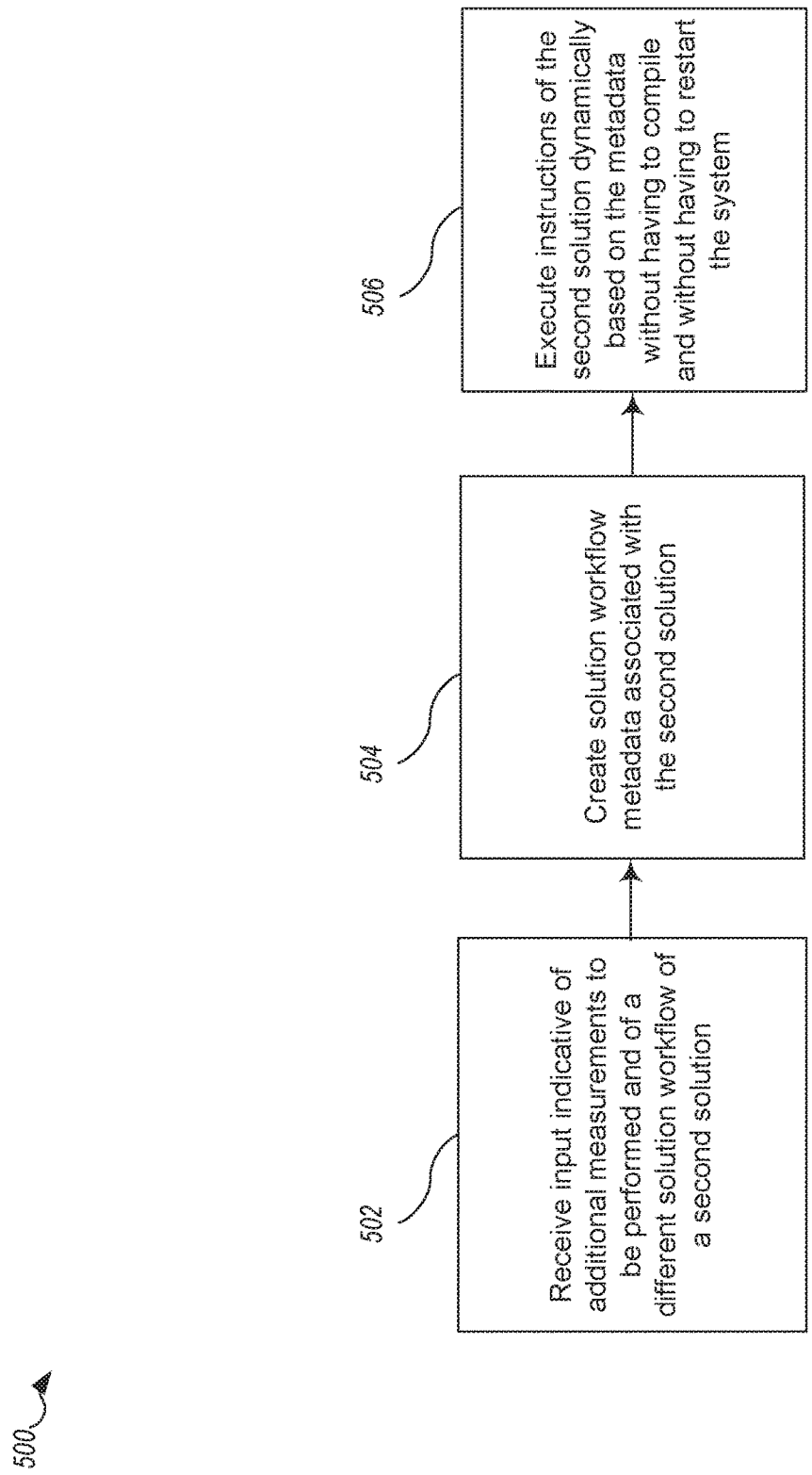
FIG. 5 is a flow diagram of a computerized method for creating and executing multiple automated test suites in a test and measurement system without having to restart the system between execution of the test suites, according to various example embodiments.

FIG. 5 is a flow diagram of a computerized method 500 for creating and executing multiple automated test suites in a test and measurement system 100 without having to restart the system between execution of the test suites, according to various example embodiments.

At 502, the system 100 receives input indicative of additional measurements to be performed and of a different solution workflow of a second solution that comprises another automation test suite.

At 504, the system 100 creates solution workflow metadata associated with the second solution in response to receiving the input.

At 506, the system 100 executes instructions of the second solution dynamically based on the metadata associated with the second solution in order to perform measurements on the DUT without having to compile and without having to restart the test and measurement system between the execution of the instructions of the first solution and the execution of the instructions of the second solution.

Figure 6:
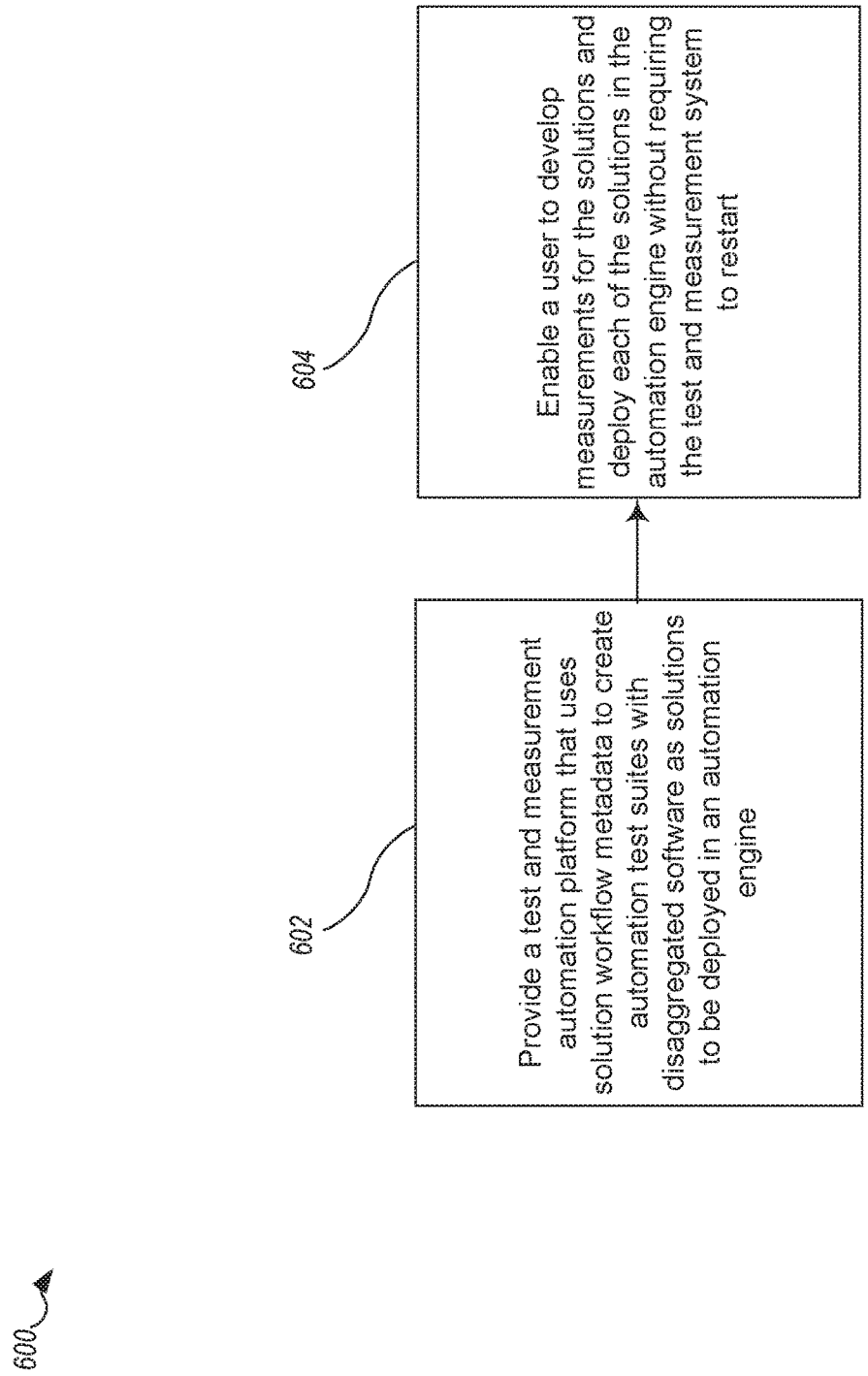
FIG. 6 is a flow diagram of a computerized method for enabling creation of automated test suites in a test and measurement system, according to various example embodiments.

FIG. 6 is a flow diagram of a computerized method 600 for enabling creation of automated test suites in a test and measurement system 100, according to various example embodiments.

At 602, the system 100 provides a test and measurement automation platform that uses solution workflow metadata to create automation test suites with disaggregated software as solutions to be deployed in an automation engine of the test and measurement automation platform.

At 604, the system 100 enables, by the test and measurement automation platform, a user to develop measurements for the solutions and deploy each of the solutions in the automation engine of the test and measurement automation platform without requiring the test and measurement system to restart.

While various embodiments have been described herein above, it is to be appreciated that various changes in form and detail may be made without departing from the spirit and scope of the invention(s) presently or hereafter claimed.

The invention claimed is:

1. A computerized method for creating and executing automated test suites in a test and measurement system, comprising:
receiving, by at least one computer processor, input indicative of measurements to be performed for a device under test (DUT) and a solution workflow of a first solution that comprises an automation test suite; and
executing, by at least one computer processor, instructions of the first solution dynamically in order to perform measurements on the DUT without having to compile the first solution.

2. The method of claim 1 further comprising:
creating, by at least one computer processor, solution workflow metadata associated with the first solution in response to receiving the input.

3. The method of claim 2 wherein the executing the instructions includes using the solution workflow metadata to facilitate the execution of the instructions of the first solution dynamically without having to compile the first solution.

4. The method of claim 3 further comprising:
using, by at least one computer processor, the solution workflow metadata to build the first solution to prepare it for execution without compiling after the first solution is deployed in the test and measurement system.

5. The method of claim 3 wherein the executing the instructions of the first solution is based on the solution workflow metadata associated with the first solution.

6. The method of claim 3 wherein the executing the instructions includes using the solution workflow metadata to facilitate the execution of the first solution dynamically without requiring the test and measurement system to restart.

7. The method of claim 3 further comprising providing a user interface that is configured to, in response to user input, communicate with an application programming interface (API) to execute the solution workflow based on the solution workflow metadata as part of execution of the instructions.

8. The method of claim 3 further comprising:
receiving, by at least one computer processor, input indicative of additional measurements to be performed and of a different solution workflow of a second solution that comprises another automation test suite;
creating, by at least one computer processor, solution workflow metadata associated with the second solution in response to receiving the input; and
executing, by at least one computer processor, instructions of the second solution dynamically based on the solution workflow metadata associated with the second solution in order to perform measurements on the DUT without having to compile and without having to restart the test and measurement system between the execution of the instructions of the first solution and the execution of the instructions of the second solution.

9. The method of claim 1 wherein the executing the instructions includes calling multiple services which are self-registered as part of the test and measurement system.

10. The method of claim 1 wherein an automation engine of the test and measurement automation platform is built on a distributed architecture and supports failover and recovery.

11. A computerized method for enabling creation of automated test suites in a test and measurement system, comprising:
providing, by at least one computer processor, a test and measurement automation platform that uses solution workflow metadata to create automation test suites with disaggregated software as solutions to be deployed in an automation engine of the test and measurement automation platform; and
enabling, by the test and measurement automation platform, a user to develop measurements for the solutions and deploy each of the solutions in the automation engine of the test and measurement automation platform without requiring the test and measurement system to restart.

12. The method of claim 11 wherein the providing the test and measurement automation platform includes providing a test and measurement automation platform that is configured to:
receive input about a first one of the solutions; and
execute instructions of the first one of the solutions dynamically in order to perform tests on an integrated circuit.

13. The method of claim 12 wherein the providing the test and measurement automation platform includes providing a test and measurement automation platform that is configured to create the solution workflow metadata associated with the first one of the solutions in response to receiving the input about the first one of the solutions.

14. The method of claim 13 wherein the providing the test and measurement automation platform includes providing a test and measurement automation platform that is configured to use the solution workflow metadata to facilitate the execution of the first one of the solutions dynamically in order to perform measurements on the integrated circuit.

15. The method of claim 13 wherein the providing the test and measurement automation platform includes providing a test and measurement automation platform that is configured to use the solution workflow metadata to facilitate deploying the first one of the solutions in the test and measurement system without having to compile the first one of the solutions.

16. The method of claim 13 wherein the providing the test and measurement automation platform includes providing a test and measurement automation platform that is configured to use the solution workflow metadata to build the first one of the solutions to prepare it for execution after the first one of the solutions is deployed in the test and measurement system.

17. The method of claim 13 wherein the execution of the instructions of the first one of the solutions is based on the solution workflow metadata associated with the first one of the solutions.

18. The method of claim 13 wherein the enabling, by the test and measurement automation platform, the user to develop measurements for the solutions and deploy the solutions in the automation engine of the test and measurement automation platform includes enabling use of the solution workflow metadata to facilitate the execution of the first one of the solutions dynamically in order to perform measurements on the integrated circuit without requiring the test and measurement system to restart.

19. The method of claim 13 wherein the input is indicative of measurements to be performed and solution workflow.

20. The method of claim 13 wherein the providing the test and measurement automation platform includes providing a test and measurement automation platform that includes a user interface that is configured to use an API to execute the solution workflow based on the solution workflow metadata as part of execution of the instructions in response to user input.

21. The method of claim 13 wherein the providing the test and measurement automation platform includes providing a test and measurement automation platform that is configured to:
receive input about a second one of the solutions;
create solution workflow metadata associated with the second one of the solutions in response to receiving the input about the second one of the solutions; and
execute instructions of the second one of the solutions dynamically based on the solution workflow metadata associated with the second one of the solutions in order to perform tests on the integrated circuit without having to compile and without having to restart the test and measurement system between the execution of the instructions of the first one of the solutions and the execution of the instructions of the second one of the solutions.

22. The method of claim 13 wherein the input is indicative of measurements to be performed and solution workflow, and the providing the test and measurement automation platform includes providing a test and measurement automation platform that is configured to provide an extensibility feature that enables the user to modify the solution workflow or solutions according to an additional requirement for testing of the integrated circuit.

23. The method of claim 13 wherein the providing the test and measurement automation platform includes providing a test and measurement automation platform that is configured to:
provide a user interface to facilitate building of the solutions by at least providing as part of the user interface a menu of templates of test automation workflows or solutions from which the user may select to base one or more of the solutions on.

24. The method of claim 13 wherein the providing the test and measurement automation platform includes providing a test and measurement automation platform that is configured to:
provide a user interface of the test and measurement automation platform that enables visualization by the user of how the test and measurement automation platform controls hardware, performs analysis of measurements and executes the solutions.

25. The method of claim 13 wherein the providing the test and measurement automation platform includes providing a test and measurement automation platform that is configured to receive the input via a user interface and application programming interface (API).

26. The method of claim 13 wherein the execution of the instructions includes calling multiple services which are self-registered as part of the test and measurement system.

27. The method of claim 13 wherein the automation engine of the test and measurement automation platform is built on a distributed architecture and supports failover and recovery.

28. A system for creating and executing automated test suites in a test and measurement system, the system for creating automated test suites comprising:
at least one memory; and
at least one processor coupled to the at least one memory, wherein the at least one memory has computer-executable instructions stored thereon that, when executed, cause the at least one processor to:
receive input indicative of measurements to be performed for a device under test (DUT) and a solution workflow of a first solution that comprises an automation test suite; and
execute instructions of the first solution dynamically in order to perform measurements on the DUT without having to compile the first solution.

29. The system of claim 28 wherein the computer-executable instructions, when executed, further cause the at least one processor to:
create solution workflow metadata associated with the first solution in response to receiving the input.

30. The system of claim 29 wherein the execution of the instructions includes use of the solution workflow metadata to facilitate the execution of the instructions of the first solution dynamically without having to compile the first solution.

31. The system of claim 30 wherein the computer-executable instructions, when executed, further cause the at least one processor to:
use the solution workflow metadata to build the first solution to prepare it for execution without compiling after the first solution is deployed in the test and measurement system.

32. The system of claim 30 wherein the execution of the instructions of the first solution is based on the solution workflow metadata associated with the first solution.

33. The system of claim 30 wherein the execution of the instructions includes use of the solution workflow metadata to facilitate the execution of the first solution dynamically without requiring the test and measurement system to restart.

34. The system of claim 30 wherein the computer-executable instructions, when executed, further cause the at least one processor to:
provide a user interface that is configured to, in response to user input, communicate with an application programming interface (API) to execute the solution workflow based on the solution workflow metadata as part of execution of the instructions.

35. The system of claim 30 further wherein the computer-executable instructions, when executed, further cause the at least one processor to:
receive input indicative of additional measurements to be performed and of a different solution workflow of a second solution that comprises another automation test suite;
create solution workflow metadata associated with the second solution in response to receiving the input; and
execute instructions of the second solution dynamically based on the solution workflow metadata associated with the second solution in order to perform measurements on the DUT without having to compile and without having to restart the test and measurement system between the execution of the instructions of the first solution and the execution of the instructions of the second solution.

36. The system of claim 28 wherein the execution of the instructions includes calling multiple services which are self-registered as part of the test and measurement system.

37. The system of claim 28 wherein an automation engine of the test and measurement automation platform is built on a distributed architecture and supports failover and recovery.

38. A non-transitory computer-readable storage medium, having computer executable instructions stored thereon that, when executed by at least one processor, cause the at least one processor to:

receive input indicative of measurements to be performed for a device under test (DUT) and a solution workflow of a first solution that comprises an automation test suite; and execute instructions of the first solution dynamically in order to perform tests on the DUT without having to compile the solution.

39. The non-transitory computer-readable storage medium of claim 38 wherein the computer-executable instructions, when executed, further cause the at least one processor to:

create solution workflow metadata associated with the first solution in response to receiving the input.

40. The non-transitory computer-readable storage medium of claim 39 wherein the execution of the instructions includes use of the solution workflow metadata to facilitate the execution of the first solution dynamically without having to compile.

41. The non-transitory computer-readable storage medium of claim 39 wherein the measurements to be performed for the DUT are signal measurements including one or more of: jitter measurements, base measurements, eye measurements, time measurements and amplitude measurements.

\* \* \* \* \*